US005661059A

United States Patent [19]
Liu et al.

[11] Patent Number: 5,661,059
[45] Date of Patent: Aug. 26, 1997

[54] BORON PENETRATION TO SUPPRESS SHORT CHANNEL EFFECT IN P-CHANNEL DEVICE

[75] Inventors: David Liu; Hao Fang, both of Cupertino, Calif.

[73] Assignee: Advanced Micro Devices, Sunnyvale, Calif.

[21] Appl. No.: 423,109

[22] Filed: Apr. 18, 1995

[51] Int. Cl.$^6$ .................................. H01L 21/265
[52] U.S. Cl. ............................. 438/276; 438/289
[58] Field of Search ........................ 437/44, 45, 57

[56] References Cited

U.S. PATENT DOCUMENTS

| | | | |
|---|---|---|---|
| 4,587,709 | 5/1986 | Fowler et al. ................... | 29/45 |
| 4,701,423 | 10/1987 | Szluk .............................. | 437/57 |
| 5,091,324 | 2/1992 | Hsu et al. ....................... | 437/34 |
| 5,407,849 | 4/1995 | Khambaty et al. ............. | 437/45 |
| 5,548,143 | 8/1996 | Lee .................................. | 257/269 |

*Primary Examiner*—John Niebling
*Assistant Examiner*—Michael S. Lebentrott
*Attorney, Agent, or Firm*—David H. Jaffer

[57] ABSTRACT

A method for forming a set of p-channel devices with enhanced n-doping and penetration of boron into the channel region between the source and drain regions, thereby creating channel length independent p-channel threshold voltage behavior. Long channel and short channel transistors have approximately equal threshold voltages as (a) short channel effect is reduced with increased n-doping in short channel transistors (where boron penetration has little effect), and (b) the effects of boron penetration and increased n-doping are offset in longer channel transistors.

6 Claims, 8 Drawing Sheets

BORON PENETRATION TO SUPPRESS SHORT CHANNEL EFFECT IN P-CHANNEL DEVICE

BACKGROUND OF THE INVENTION

1. Field of the Invention

This invention relates generally to a method for forming a p-channel semiconductor device in which the threshold voltage is not a function of channel length, and more particularly to a method which utilizes boron penetration to suppress short channel effect.

2. Brief Description of the Prior Art

Metal oxide semiconductor (MOS) devices are well known in the prior art. FIG. 1 illustrates a p-type MOS device. The device 10 includes an n-doped silicon layer 12, and p-doped silicon source 14 and drain 16 regions. Note that the n-doped silicon substrate could also be an n-well or n-tub inside a p-substrate. The separation between the drain and source regions is typically around 0.8 μm in the present state of the art. A layer of silicon dioxide 20 overlies these areas, and a polysilicon layer 22 is placed over the area ("channel") between source and drain regions, defining a "gate" region. Normally with 0V or positive voltage on the gate, no p-type conduction is formed between the source and drain regions, thus no current can flow between them. When a negative bias is applied across the gate region, the n-type region in channel 18 will gradually be depleted away until it becomes "inverted", i.e., a p-type conduction region is formed out of the n-type region that connects source and drain regions 14 and 16. Current can then flow from source region to drain region through the inversion layer in channel region 18. FIG. 2(a) illustrates that for a fixed channel length (typically on the order of 0.8 μm), the current from the source to the drain region will approach a constant value known as saturation current when the gate voltage is increasing in the negative direction and reaches the threshold level ($V_t$) where current flow reaches a level suitable for reliable operation of the device.

FIG. 2(b) illustrates current flow from source to drain regions with different channel lengths. Note that at shorter channel lengths, current flows even at positive voltages, and reliable device performance (which requires that the device be distinctly "on" or "off") cannot be obtained.

FIG. 3 illustrates that threshold voltage is dependent on the length of the p-channel transistor. In order to obtain satisfactory performance, the channel length used must be at least as great as that required to reach the relatively flat portion of the curve shown in FIG. 3. Since device size is limited by the channel length, reduction of the channel length is desired to obtain devices with smaller geometry. The "short channel" effect shown in FIG. 3 (i.e. variation in threshold voltage at short channel lengths) limits device geometry. Typically, additional n-doping could be added to raise the threshold voltage ($V_T$) of short channel transistors (i.e. 0.7 μm or less). However, such doping also affects longer channel transistors. Hence, the $V_T$ for these longer channels is higher than desirable because the higher $V_T$ will render low current drive and consequently the devices will be slower.

SUMMARY OF THE INVENTION

It is the primary object of the present invention to provide a p-channel device in which the "short channel" effect is suppressed by a combination of boron penetration and increased n-doping.

Another object of the present invention is to provide an improved method for formation of a p-channel semiconductor device which utilizes boron penetration to suppress the "short channel" effect and create a device whose threshold voltage is not a function of channel length.

Briefly, the preferred embodiment of the present invention is a method for forming a set of p-channel devices by selectively allowing boron to penetrate into the channel region (ordinarily an undesirable phenomenon) between the source and drain regions, thereby creating channel length independent p-channel threshold voltage behavior. The effects of boron penetration and increased n-doping are offset in longer channel transistors, and of increased n-doping in short channel transistors (where boron penetration has little effect), provide a device in which long channel and short channel transistors have approximately equal threshold voltages.

IN THE DRAWING

Figure 4A:
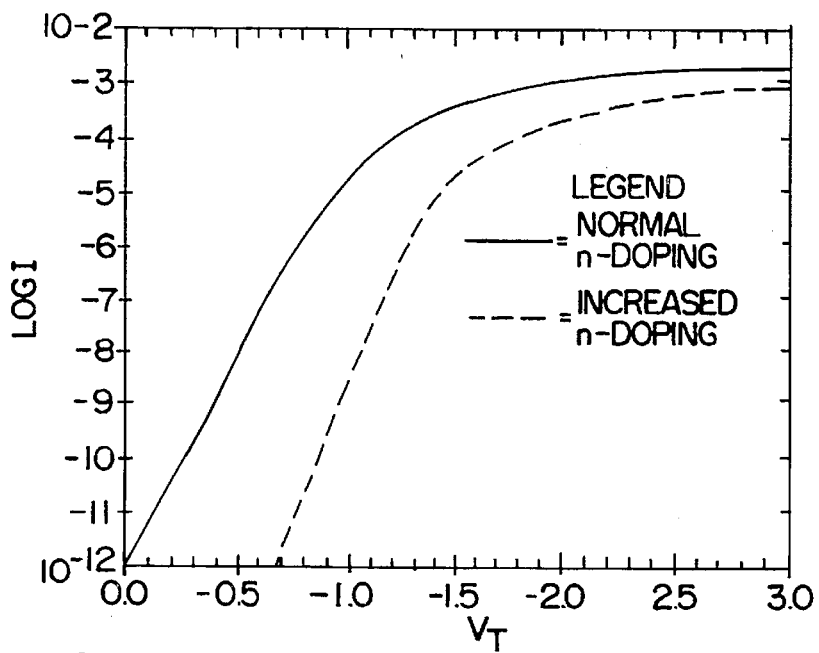
Figure 4B:
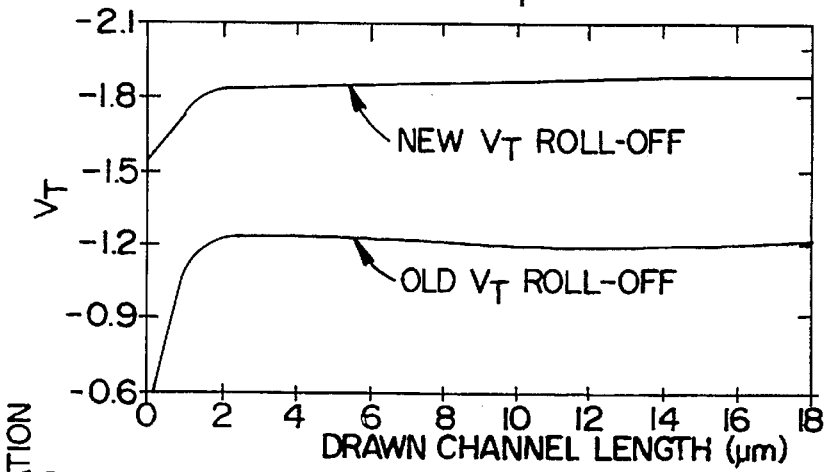
Figure 5:
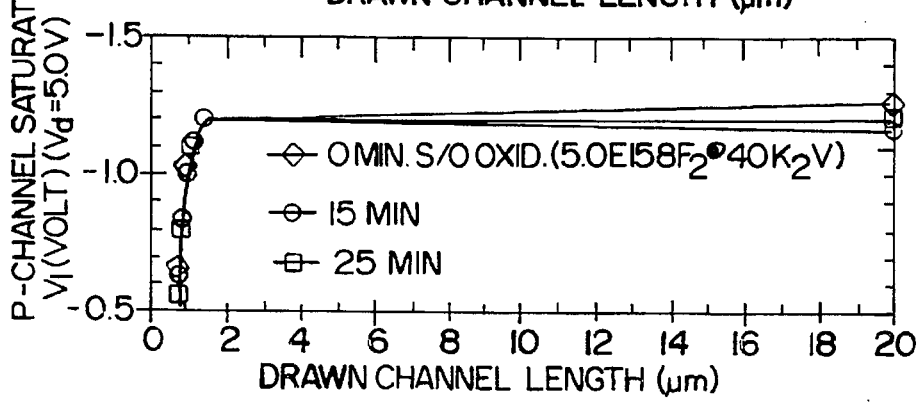
Figure 6:
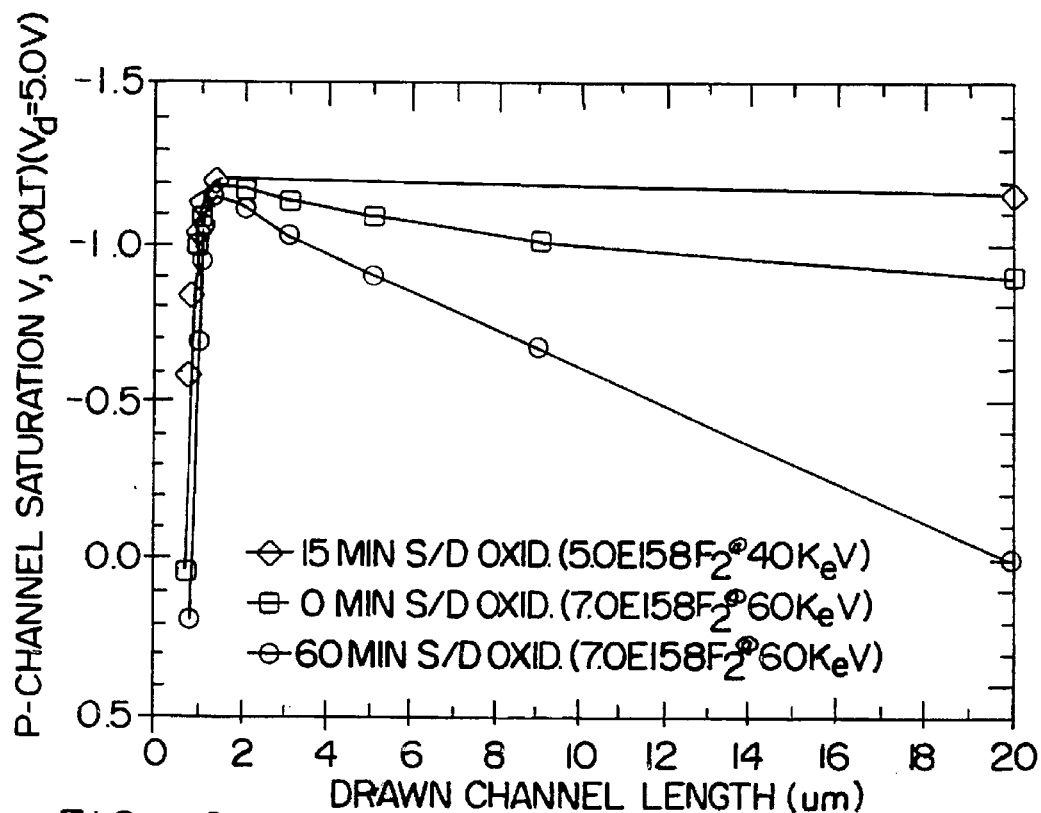
Figure 7A:
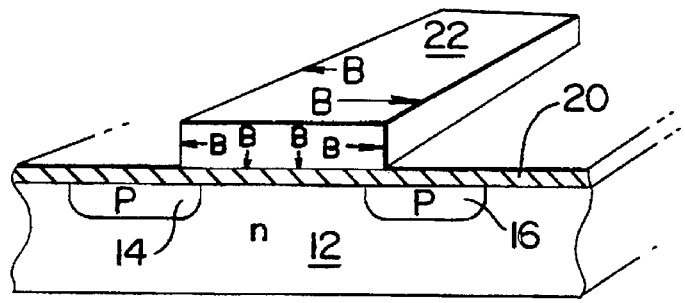
Figure 7B:
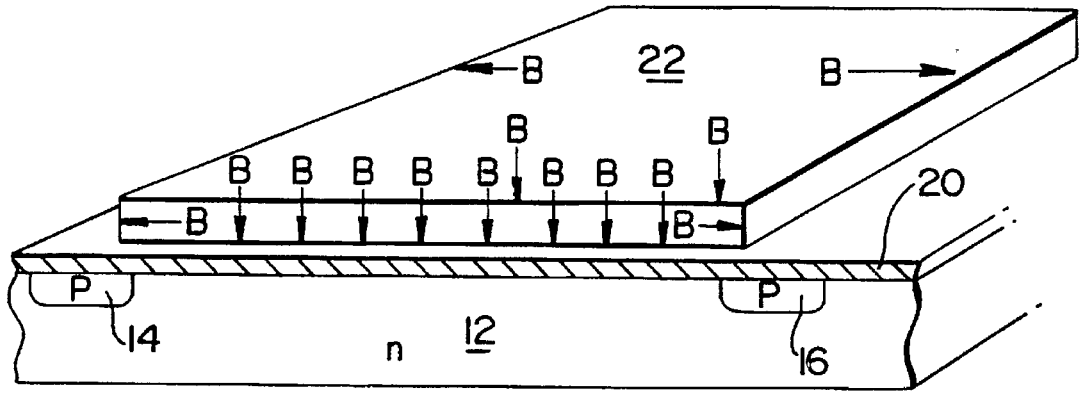
Figure 7C:
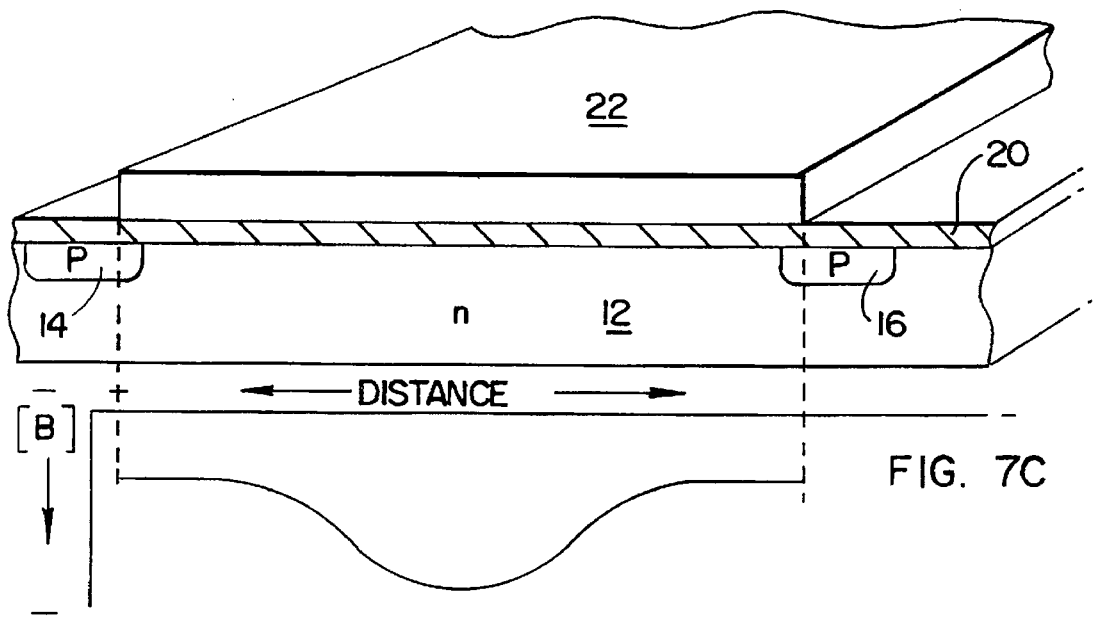
Figure 7D:
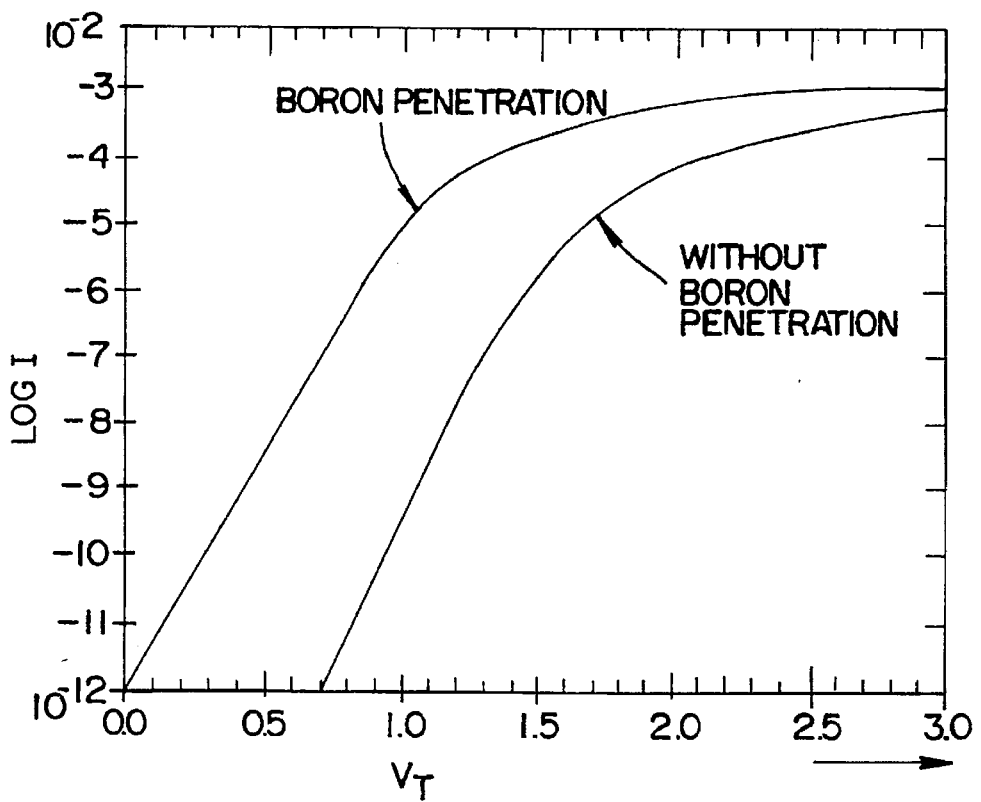
Figure 8:
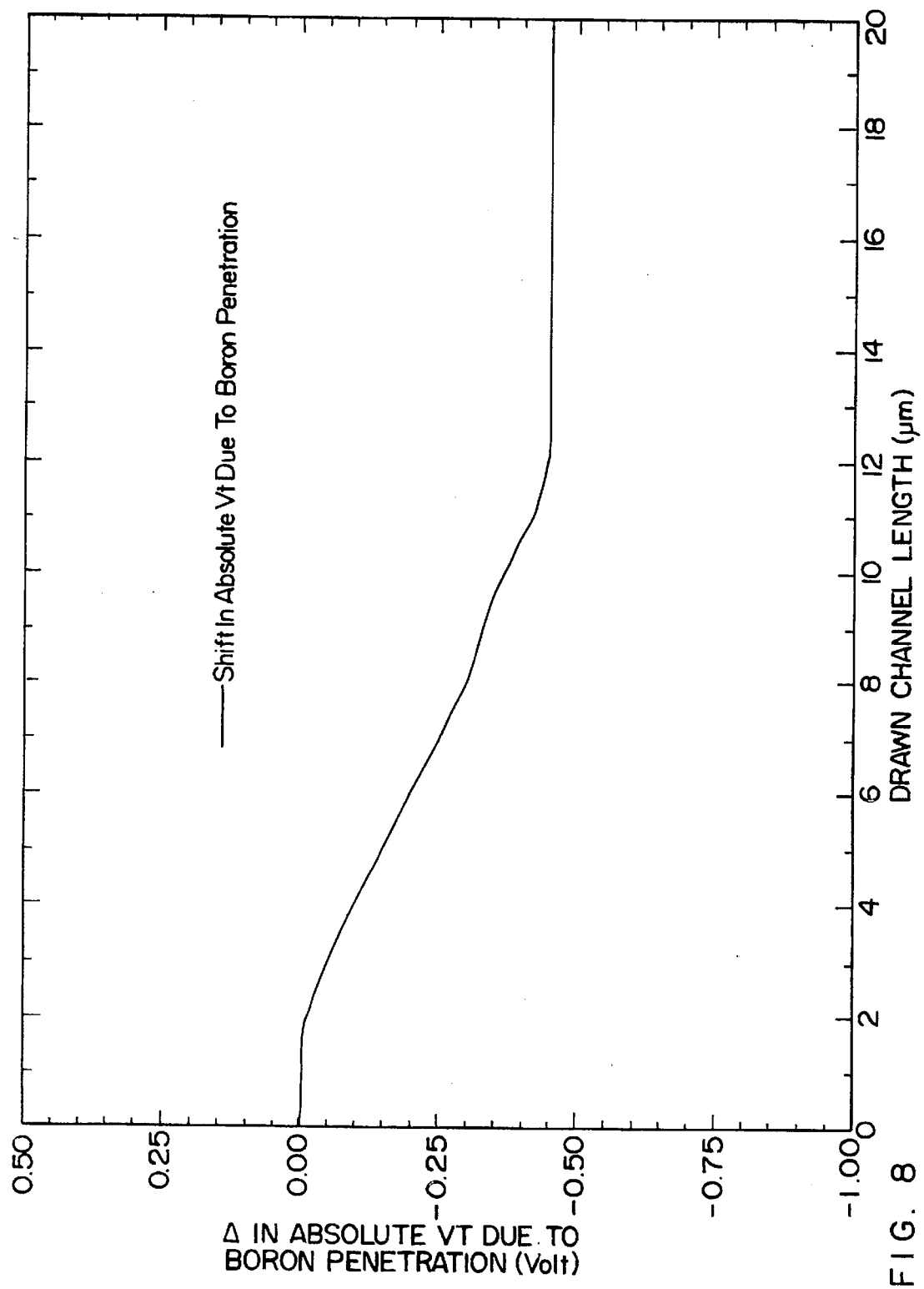
Figure 9:
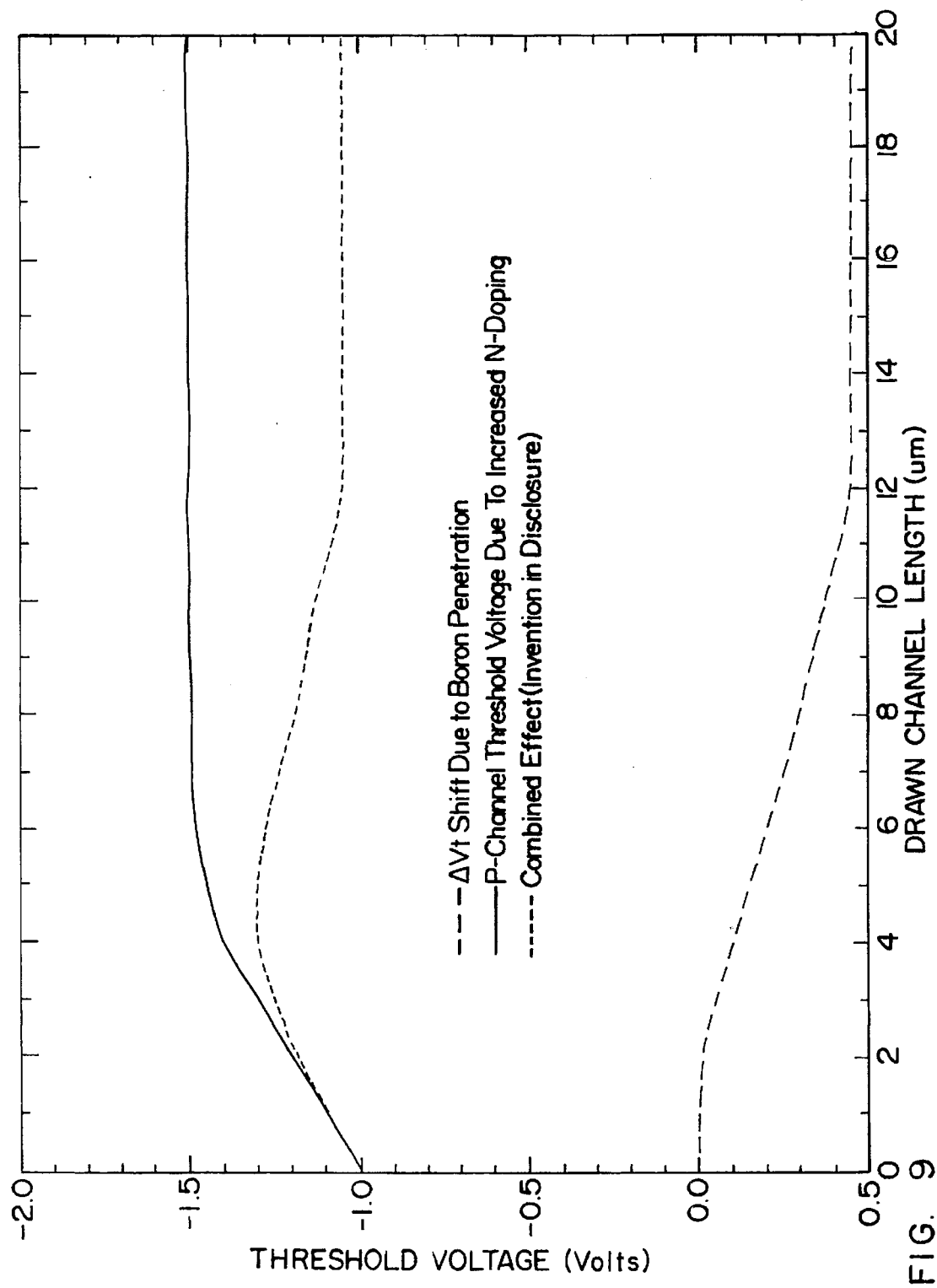
Figure 10A:
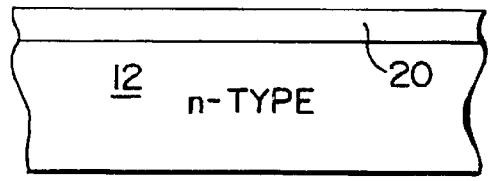
Figure 10B:
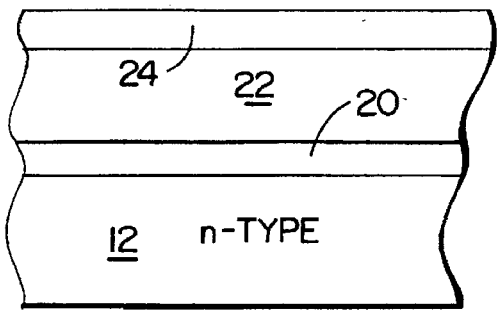
Figure 10C:
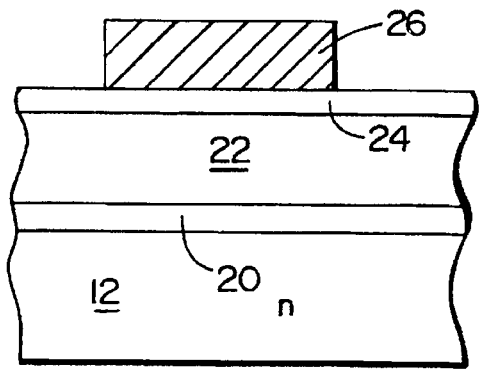
Figure 10D:
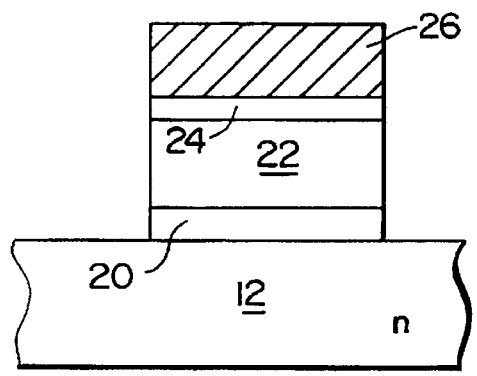
Figure 10E:
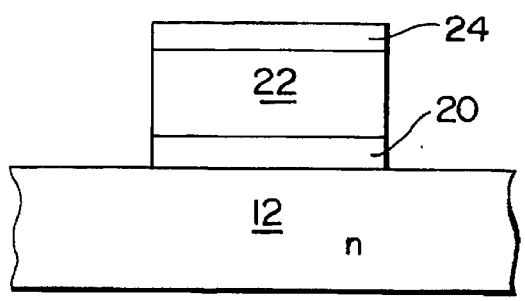
Figure 10F:
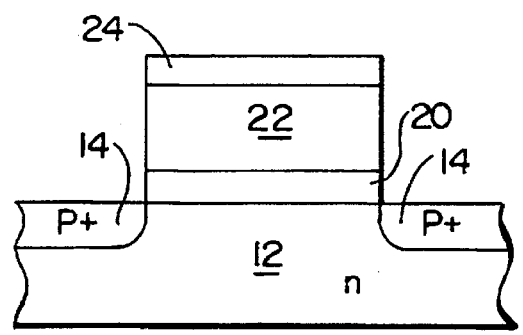
Figure 10G:
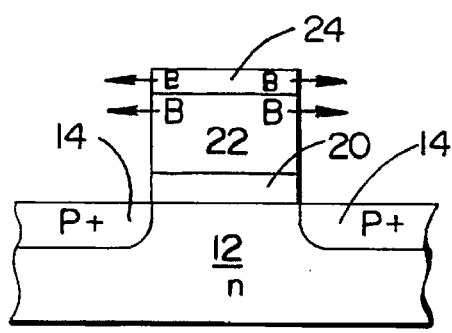
Figure 10H:
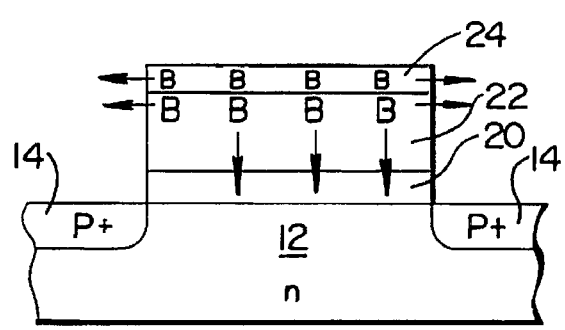

FIGS. 4(a) and (b) illustrate the effect of increased n-doping on threshold Voltage behavior;

FIG. 5 shows the characteristics of p-channel threshold voltages when the effect of boron penetration is minimized;

FIG. 6 illustrates the effect of various degrees of boron penetration on threshold voltage and its impact on different channel length transistors;

FIGS. 7(a) and (b) show boron diffusion in polysilicon pads of different length;

FIG. 7(c) shows boron concentration as a function of position along the channel length;

FIG. 7(d) shows the effect of boron penetration on threshold voltage in a long channel device;

FIG. 8 shows the effect of boron penetration on threshold voltage;

FIG. 9 shows the resultant channel length independent p-channel threshold voltage behavior when the boron penetration effect of FIG. 8 is combined with the short channel effect of FIG. 4(b); and FIGS. 10(A)–10(H) shows a process sequence in accordance with the present invention.

DETAILED DESCRIPTION OF THE PREFERRED EMBODIMENT

Figure 3:
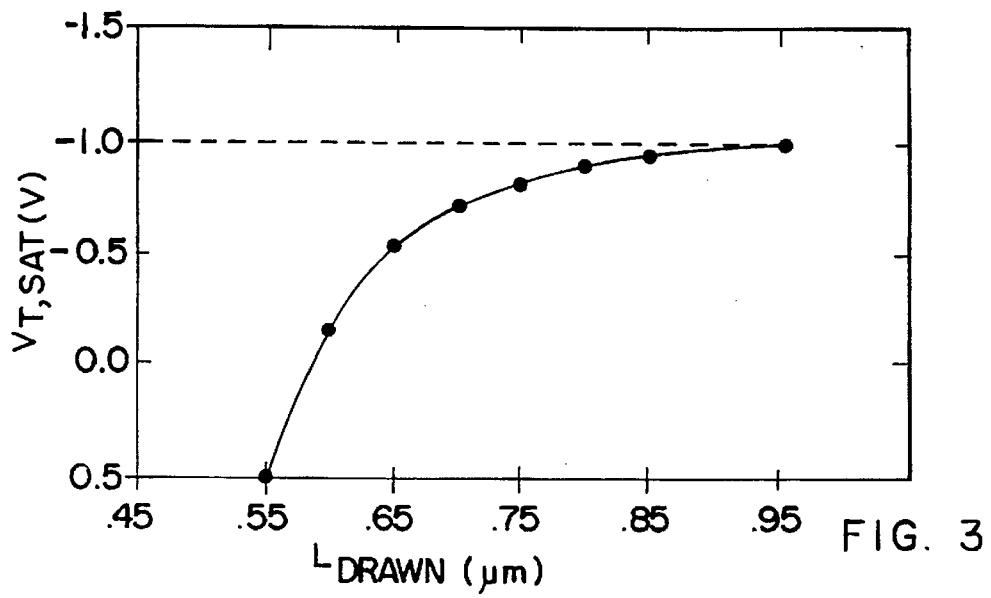
FIG. 3 shows dependence of threshold voltage on channel length in the type of device shown in FIG. 1.
Figure 2B:
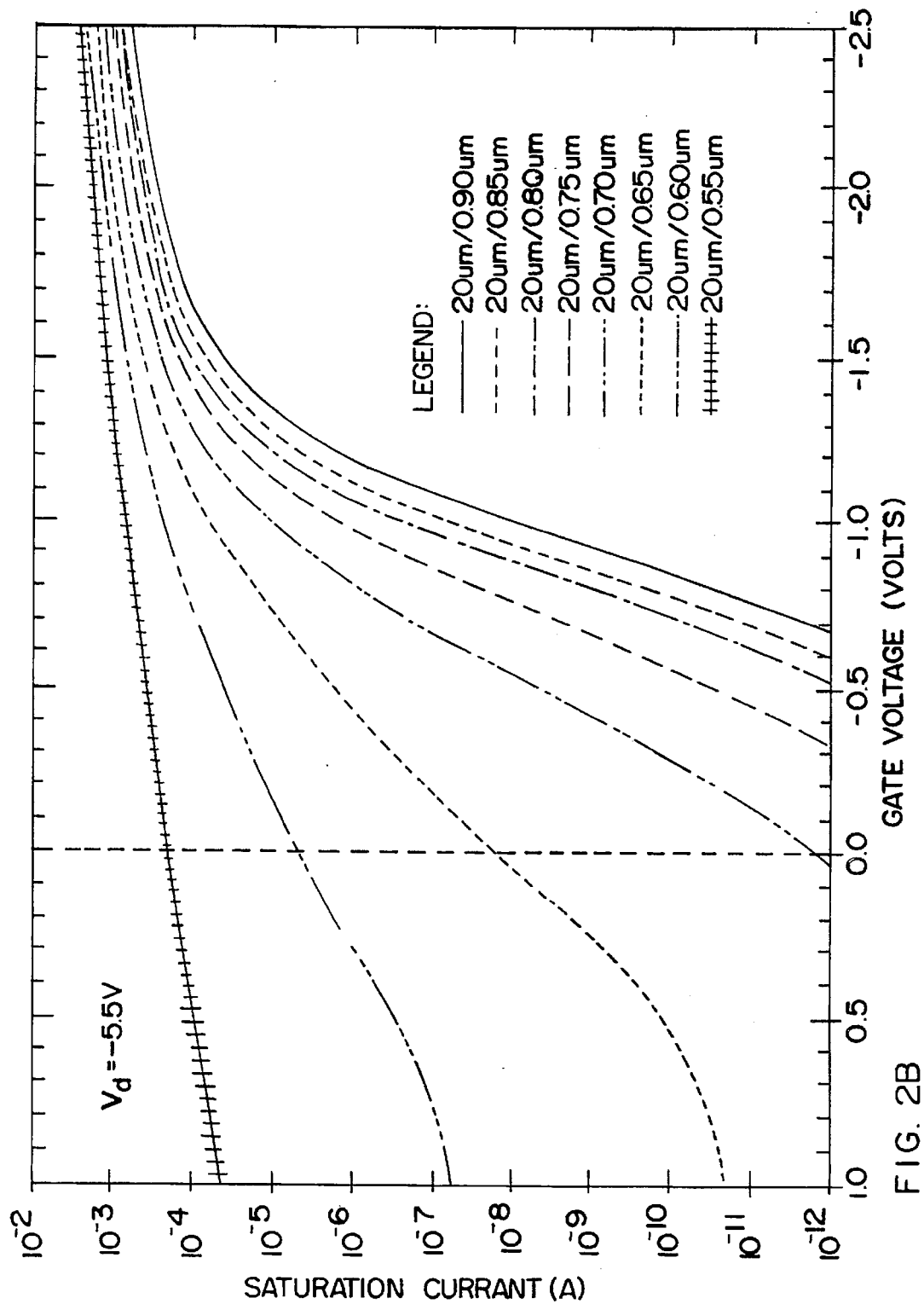
FIG. 2(b) illustrates current flow from the source to drain regions as a function of channel length.

With reference to FIG. 3, fall off of threshold voltage with channel length is shown. The example in this graph shows a threshold voltage of around −1.0 V, but it should be understood that threshold voltages vary with different technologies. The present invention is not limited to a particular threshold voltage. Line widths in semiconductor devices manufactured with the current state of the art typically vary from 0.8 μm to 20 μm within a single chip. "Short channel effect" limits use of smaller line widths. In order to obtain stable performance, it is desirable to have threshold voltage remain relatively constant regardless of channel length (around −1.0 V in the example in FIG. 3). This ideal performance is shown by the horizontal dashed line in FIG. 3. The present invention uses increased n-doping and boron penetration to obtain threshold voltage behavior which is relatively constant from channel lengths of 0.1 µm to 20 µm, so that the threshold behavior in the resultant chip is relatively constant regardless of channel length.

FIGS. 4(a) and (b) illustrate the shift in threshold voltage behavior that can be achieved by increasing the dopant concentration of the n-doped region of a device. This method will increase the threshold voltage of the shorter channel and longer channel transistors simultaneously. Note that the threshold voltage is increased to a greater absolute value of $V_t$ by increased n-doping. The increase in threshold voltage as shown in FIGS. 4(a) and (b) can be achieved with techniques and process conditions that are well known in the art, but such increases are generally not desirable since the long channel devices will then have too high threshold voltages (causing current drive to be small). The present process can be easily adjusted with techniques known in the art to achieve the desired level of n-doping, which will vary with the technology used. In general, the level of n-doping used in current technology is in the range of $10^{16}$ cm$^{-3}$ to $10^{18}$ cm$^{-3}$, and preferably in the range of $10^{17}$ cm$^{-3}$ to $10^{18}$ cm$^{-3}$, but the present technique is general and can be used with different levels of n-doping.

Referring again to FIG. 1, in a conventional CMOS process, tungsten silicide is often use as a low-resistance gate material on top of polysilicon gate 22. Tungsten silicide formation usually involves a reduction process from a fluorine precursor species. In addition, the p-doped source and drain regions are formed by implanting with BF$_2$+ ions. Both of these processes introduce fluorine atoms into polysilicon gate 22. These fluorine atoms enhance the diffusion of boron through the polysilicon layer, and aid diffusion of boron through the gate oxide (i.e., the silicon dioxide 20 below polysilicon 22) into channel region 18. In the prior art, special care is required to eliminate boron penetration into the channel region. If care is not taken, threshold voltage instability as a function of channel length is observed.

FIG. 5 shows the characteristics of p-channel threshold voltages as a function of channel length with the effect of boron penetration is minimized through control of process conditions. FIG. 6 is an example of the typical characteristics of p-channel device threshold voltages as a function of channel length, with varying degrees of boron penetration. Thermal cycle and the p-implant dosage are the main driving forces for boron diffusion through the polysilicon into the gate oxide. In general, the thickness of the polysilicon gate plays a major role in determining the onset of the threshold voltage roll-off due to boron penetration.

FIGS. 5 and 6 show that the effect of threshold voltage instability due to boron penetration impacts devices with long channel lengths, rather than devices with short channel lengths. The threshold voltage roll-off on the left of the channel length scale in both FIGS. 5 and 6 is due to the "short channel effect" (drain-induced barrier-lowering effect). The threshold voltage in the short channel regime is not affected at all by boron penetration.

Figure 1:
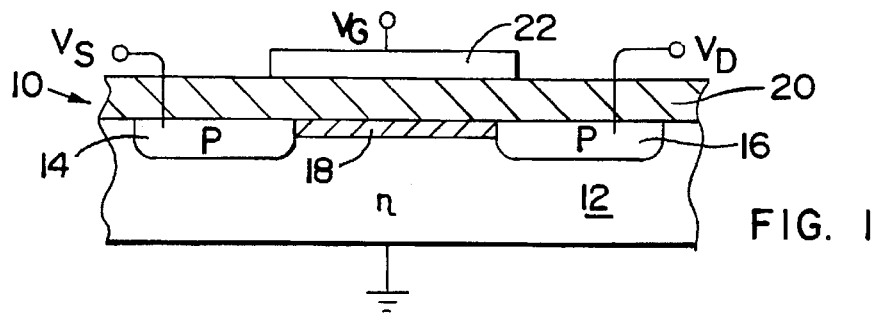
FIG. 1 illustrates a p-type MOS device.
Figure 2A:
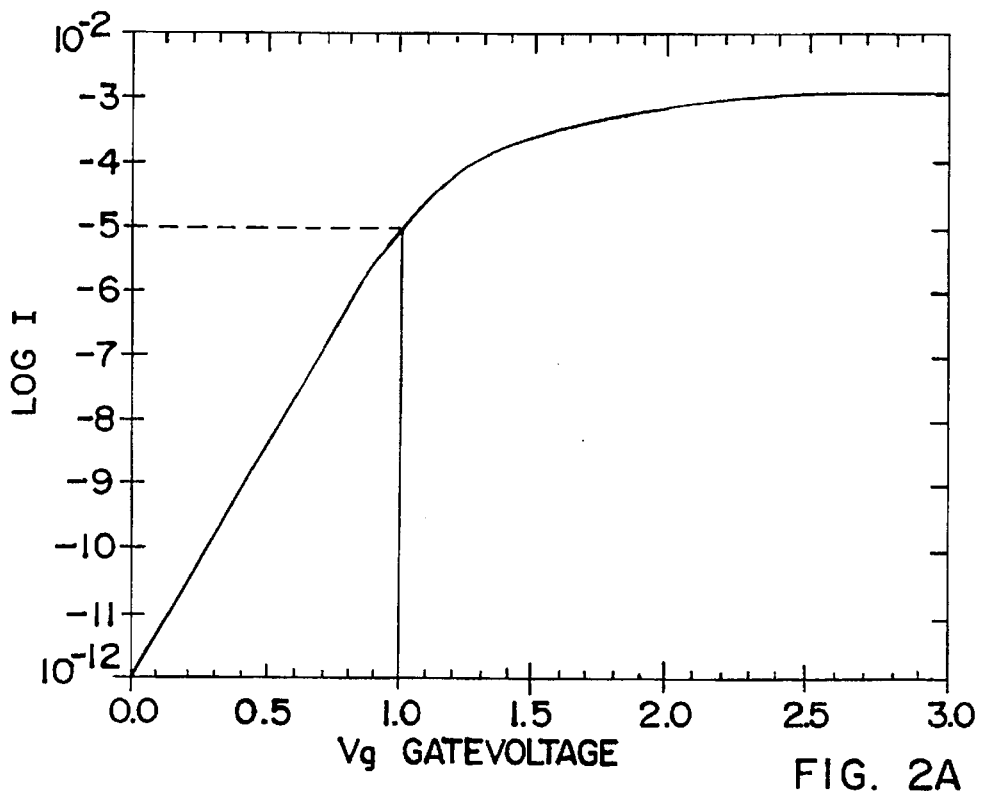
FIG. 2(a) illustrates current flow from the source to the drain region of the type of device shown in FIG. 1.

The reason that boron penetration does not affect threshold voltages for short channel lengths is illustrated in FIGS. 7(a) and 7(b), which show the diffusion of boron atoms from a polysilicon gate area such as 22 in FIG. 1. FIG. 7(a) illustrates a short channel device. When the polysilicon pad is short, boron will diffuse out of the polysilicon because it has less distance to go to the walls of the polysilicon than to the oxide and n-doped layer. Boron atoms diffuse into the ambient from the site of the polysilicon gate edge before they make it down to the polysilicon/oxide (20/22) interface.

However, in a longer channel device such as shown in FIG. 7(b), boron will diffuse through polysilicon to the n-doped layer because the length out of the polysilicon layer is greater than the distance to the n-doped layer. As FIG. 7(c) shows, the distribution of boron will thus tend to be greater in the center of the polysilicon pad. Hence, the boron penetration will have greater effect as channel length increases. This schematic illustration correlates well with the effect shown in FIG. 6. FIG. 7(d) shows that the effect on threshold voltage for a long channel device with boron penetration, shifting the threshold voltage curve to the left. FIG. 8 illustrates the change in threshold voltage due to boron penetration, i.e., boron penetration decreases the absolute value of the threshold voltage.

The phenomena illustrated in FIG. 8 (fall off of threshold voltage with increasing channel length due to boron penetration) and FIG. 4 (the ability to tailor threshold voltage roll-off by tailoring polysilicon gate thickness with control of doping and phosphorus concentration and polysilicon) may be combined. The combination of the n-doping effect threshold voltage increase shown in FIG. 4 and the boron penetration effect shown in FIG. 8 yield a process where the short channel effect and the boron penetration effect (both of which are considered problems to be overcome in manufacturing) are used together to create threshold behavior that is relatively independent of channel length. FIG. 9 illustrates that combination of the effects shown in FIGS. 4(b) (upper curve in FIG. 9) and 8 (lower curve in FIG. 9) creates a device which has the performance of the middle curve of FIG. 9, i.e., p-channel threshold voltage behavior that is relatively constant from short through long channels (preferably varying by less than 0.3 V, and more preferably by 0.1 V or less).

FIG. 10 illustrates a method in accordance with the present invention for constructing a set of devices in a chip (typically transistors devices) with different channel lengths but relatively constant threshold voltage. FIG. 10(a) shows an n-doped silicon substrate 12 on which gate oxide 20 is grown. Typical gate oxide thickness range is between 80–150 Angstroms. Note that the n-doped silicon substrate could also be an n-well or n-tub inside a p-substrate. In FIG. 10(b), polysilicon 22 is deposited by CVD over the oxide. Polysilicon thickness is tailored, depending on the overall amount of the thermal budget in the process, in order to obtain the maximum benefit of this invention. In the preferred embodiment, polysilicon thickness around 1000–1500 Angstroms is used. Tungsten silicide 24 with thickness of 1500–2000 Angstroms is also deposited to reduce the resistance of the polysilicon gate. FIG. 10(c) shows patterned photoresist 26 over these layers. In FIG. 10(d), the tungsten silicide 24, polysilicon 22 and oxide 20 are etched, removing the tungsten silicide, polysilicon and oxide which are not protected by photoresist 26. After stripping of the photoresist as shown in FIG. 10(e), a pad consisting of tungsten silicide and polysilicon remains over the gate oxide. In FIG. 10(f), BF$_2$+ ion implantation takes place, with dosage in the range of $5 \times 10^{15}$ cm$^{-2}$ to $7 \times 10^{15}$ cm$^{-2}$ and implant energy of 60 KeV, which creates p-doped layers 14 on both sides of the gate oxide. (Boron implantation dosage will vary with the process used. With present processes, implantation dosage in the range of $10^{15}$ cm$^{-2}$ to $10^{16}$ cm$^{-2}$ is preferred.) The tungsten silicide 24 and polysilicon layers 22 overlying the gate oxide 20 also receive boron ions. In FIG. 10(g), the boron in a "short channel" (in this case 0.7 µm or below) polysilicon layer overlying the gate area for the most part is diffused out of the polysilicon and into the ambient. However, with long channel lengths as shown in FIG. 10(h), boron is diffused into the underlying n-type silicon layer, creating greater boron penetration effects in longer channel devices.

Although the present invention has been described above in terms of a specific embodiment, it is anticipated that alterations and modifications thereof will, no doubt, become apparent to those skilled in the art. It is, therefore, intended that the following claims be interpreted as covering all such alterations and modifications as fall within the true spirit and scope of the invention.

What is claimed is:

1. A method for controlling the threshold voltage for a set of p-channel devices formed on a semiconductor substrate, in which the devices have different channel lengths, comprising the steps of:

(a) providing an n-doped semiconductor substrate, wherein the n-doping is sufficient to control the threshold voltage within 0.3 volts for p-channel devices with channel lengths of less than 0.6 µm;

(b) forming a set of p-channel devices with gate regions having different channel lengths, said lengths varying from less than 0.6 µm to at least 3 µm; and (c) causing boron to penetrate into the gate regions of the p-channel devices, whereby the absolute values of the threshold voltage for the devices decreases with increasing channel length, thereby offsetting the effect of n-doping of the substrate for long channel lengths and creating a set of p-channel devices having said controlled threshold voltage behavior for channel lengths from less than 0.6 µm to channel lengths of greater than 3 µm, wherein the threshold voltage is defined as 85% of the saturation voltage.

2. The method of claim 1, wherein the threshold voltage is controlled within 0.3 volts for devices having channel lengths from less than 0.3 µm to greater than 10 µm.

3. The method of claim 1, wherein the n-doping level is in the range of $10^{17}$ cm$^{-3}$ to $10^{18}$ cm$^{-3}$.

4. The method of claim 3, wherein the boron implantation dosage is in the range of $10^{15}$ cm$^{-2}$ to $10^{16}$ cm$^{-2}$.

5. The method of claim 2, wherein the n-doping level is in the range of $10^{17}$ cm$^{-3}$ to $10^{18}$ cm$^{-3}$.

6. The method of claim 5, wherein the boron implantation dosage is in the range of $10^{15}$ cm$^{-2}$ to $10^{16}$ cm$^{-2}$.

* * * * *